(12) United States Patent
Kamei

(10) Patent No.: US 10,340,706 B2
(45) Date of Patent: Jul. 2, 2019

(54) ASSEMBLED BATTERY MONITORING APPARATUS AND ASSEMBLED BATTERY MONITORING SYSTEM

(71) Applicant: DENSO CORPORATION, Kariya, Aichi-pref. (JP)

(72) Inventor: Syunji Kamei, Kariya (JP)

(73) Assignee: DENSO CORPORATION, Kariya (JP)

( * ) Notice: Subject to any disclaimer, the term of this patent is extended or adjusted under 35 U.S.C. 154(b) by 399 days.

(21) Appl. No.: 15/200,409

(22) Filed: Jul. 1, 2016

(65) Prior Publication Data

US 2017/0012444 A1 Jan. 12, 2017

(30) Foreign Application Priority Data

Jul. 6, 2015 (JP) ................................. 2015-135225

(51) Int. Cl.
*G01R 31/02* (2006.01)
*H02J 7/00* (2006.01)
*G01R 31/382* (2019.01)
*G01R 31/396* (2019.01)

(52) U.S. Cl.
CPC .......... *H02J 7/0016* (2013.01); *G01R 31/382* (2019.01); *G01R 31/396* (2019.01); *H02J 7/0021* (2013.01); *H02J 7/0047* (2013.01); *H02J 2007/0095* (2013.01)

(58) Field of Classification Search
CPC .......... G01R 31/3658; G01R 19/16542; G01R 35/00; G01R 31/02
USPC ......... 324/434, 426–433; 320/116–122, 132, 320/134
See application file for complete search history.

(56) References Cited

U.S. PATENT DOCUMENTS

| 6,034,508 A | 3/2000 | Chang |
| 2009/0295396 A1* | 12/2009 | Kouchi ................ G01R 31/396 324/426 |
| 2011/0076530 A1 | 3/2011 | Miyamoto et al. |
| 2013/0099793 A1 | 4/2013 | Shimizu |
| 2014/0176148 A1* | 6/2014 | Makihara .............. H02J 7/0021 324/434 |

(Continued)

FOREIGN PATENT DOCUMENTS

| GB | 2453207 A | 4/2009 |
| JP | H10-285826 A | 10/1998 |

(Continued)

*Primary Examiner* — Jermele M Hollington
*Assistant Examiner* — Taqi R Nasir
(74) *Attorney, Agent, or Firm* — Posz Law Group, PLC

(57) ABSTRACT

An assembled battery monitoring apparatus includes: a first operation functioning device that carries out a monitoring process on an assembled battery configured by a plurality of battery cells connected in series and communicates with a host controller only in an ordinary operational timing in which the host controller controls an external power source to supply an operation power source; a second operation functioning device that carries out the monitoring process on the assembled battery in the ordinary operational timing and in a non-ordinary operational timing in which the external power source stops to supply the operation power source; and a power supply switching device that performs switching so as to enable the assembled battery to supply the operation power source in the non-ordinary operational timing.

10 Claims, 6 Drawing Sheets

(56) References Cited

U.S. PATENT DOCUMENTS

2014/0312915 A1* 10/2014 Mukaitani ............... H02J 7/007
                                                                 324/434
2015/0102820 A1    4/2015 Mizobe et al.
2016/0003915 A1*  1/2016 Kamei ............... G01R 31/3835
                                                                 324/434

FOREIGN PATENT DOCUMENTS

| JP | 2011-163847 A |   | 8/2011 |  |  |
|----|---------------|---|--------|--|--|
| JP | 2012-050272 A |   | 3/2012 |  |  |
| JP | 2013-198370 A |   | 9/2013 |  |  |
| JP | 2014-110709 A |   | 6/2014 |  |  |
| JP | 2015080289 A  | * | 4/2015 | ........... | G01R 31/362 |

* cited by examiner

ASSEMBLED BATTERY MONITORING APPARATUS AND ASSEMBLED BATTERY MONITORING SYSTEM

CROSS REFERENCE TO RELATED APPLICATION

This application is based on Japanese Patent Application No. 2015-135225 filed on Jul. 6, 2015, the disclosure of which is incorporated herein by reference.

TECHNICAL FIELD

The present disclosure relates to an assembled battery monitoring apparatus and an assembled battery monitoring system, and both of which carry out a monitoring process on an assembled battery configured by a plurality of battery cells connected in series.

BACKGROUND

A monitoring integrated circuit (hereinafter referred to as "monitoring IC") for monitoring an assembled battery is in operation through receiving the power supply from the battery cell which is an object to be monitored by itself. Accordingly, if there is a fault occurred in the battery cell, the monitoring IC does not operate and hence loses the monitoring function. In order to solve the difficulty mentioned above, the invention described in, for example, Patent Literature 1 provides a power source separately from the battery cell used as the power source for the monitoring IC so as to enhance the reliability.

However, even when the configuration disclosed in the Patent Literature 1 is used, there is no any change in consuming the energy of the battery cell when the monitoring IC receives the power supply from the battery cell. In particular, in a case of carrying out a monitoring operation, the monitoring IC carries out communication with a microcomputer as the host control device to receive a control command and send the detected data. Accordingly, it raises a difficulty in increasing the voltage variation of the battery cell with larger current consumption and hence the ability of the assembled battery cannot be used effectively.

[Patent Literature 1] JP-2011-163847-A

SUMMARY

It is an object of the present disclosure to provide: an assembled battery monitoring apparatus that operates without largely consuming the energy stored in an assembled battery; and an assembled battery monitoring system configured by the assembled battery monitoring apparatus and a host control device.

An assembled battery monitoring apparatus according to a first aspect of the present disclosure includes: a first operation functioning device that carries out a monitoring process on an assembled battery configured by a plurality of battery cells connected in series and communicates with a controller only in an ordinary operational timing in which the controller controls an external power source to supply an operation power source; a second operation functioning device that carries out the monitoring process on the assembled battery at the ordinary operational timing and in a non-ordinary operational timing in which the external power source stops to supply the operation power source; and a power supply switching device that performs switching so as to enable the assembled battery to supply the operation power source in the non-ordinary operational timing.

An assembled battery monitoring system according to a second aspect of the present disclosure includes: the assembled battery monitoring apparatus according to the first aspect of the present disclosure; and a controller.

With regard to the assembled battery monitoring apparatus according to the first aspect of the present disclosure and the assembled battery monitoring system according to the second aspect of the present disclosure, when the first and second operation functioning devices are in an ordinary operation, an operation power source is supplied by the external power source; and when the supply of the operation power source operated by the external power source is stopped at a time of having a non-ordinary operation, it is configured to switch to the supply of the power source operated by the assembled battery as the second operation functioning device carries out the monitoring process on the assembled battery. Accordingly, when the consumption current for operating both of the first and second operation functioning devices gets larger, the consumption of energy stored in the assembled battery is inhibited as much as possible.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

Figure 1:
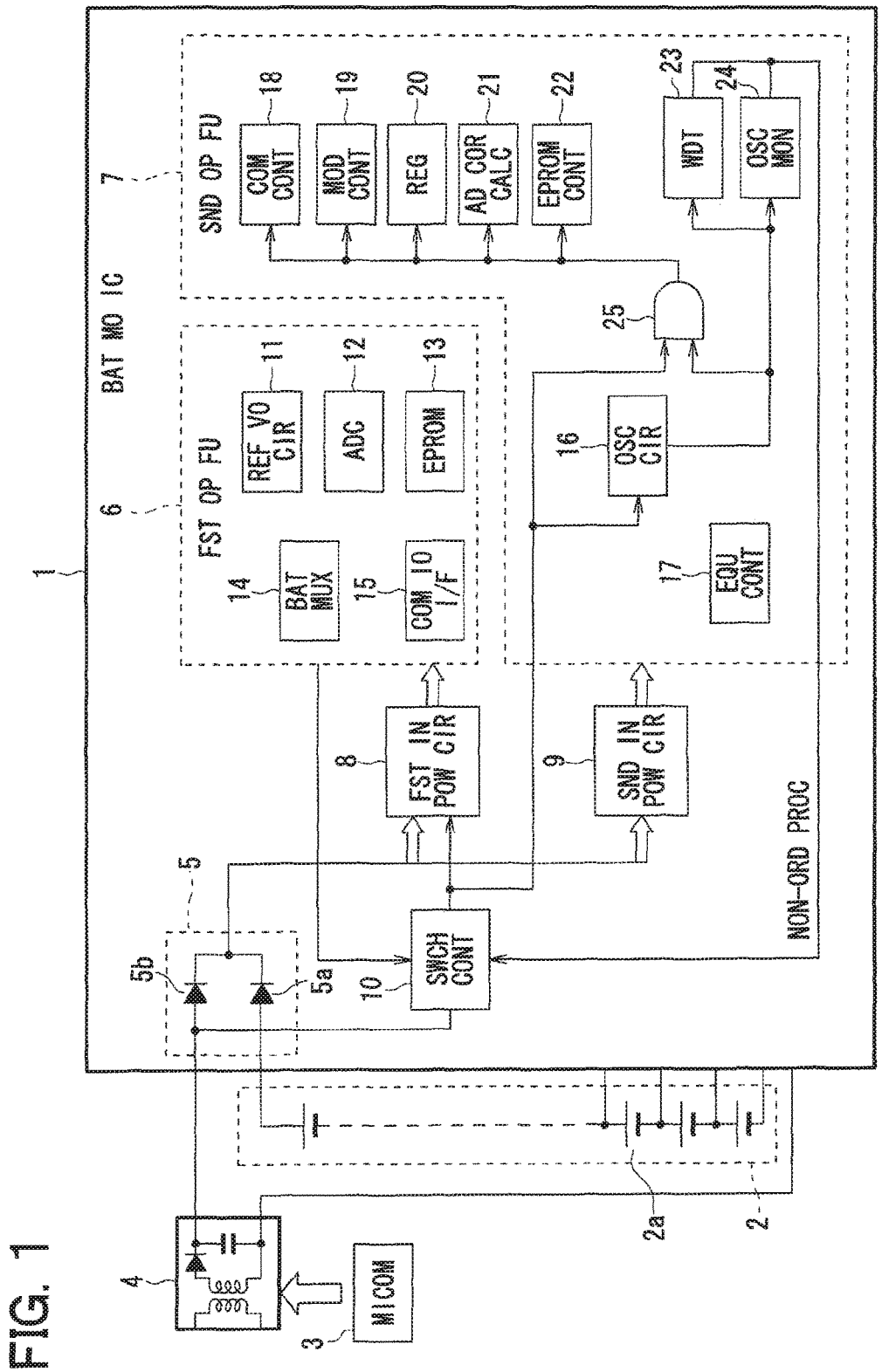
FIG. 1 is a functional block diagram that shows the configuration of an assembled battery monitoring system according to a first embodiment.

As illustrated in FIG. 1, a battery monitoring IC 1 is configured to receive the power supply from an assembled battery 2 as a monitoring target and also to receive the power supply from an external power source 4. The power supply from an external power source 4 is controlled to be in a supply mode or a stopping mode by a microcomputer 3 as the host controller. The power source supply nodes of the assembled battery 2 and the external power source 4 are respectively connected to two diodes 5a, 5b, and the cathodes of both diodes 5a, 5b are connected in common (i.e., OR connection). The diodes 5a, 5b configure a power supply switching device 5. The assembled battery 2 is configured to have a plurality of unit battery cells 2 connected in series. In addition, the external power source 4 is configured as, for example, a switching power source, and the switching control is carried out by the microcomputer 3. The battery monitoring IC 1 corresponds to an assembled battery monitoring apparatus. Moreover, the assembled battery monitoring system is configured by the battery monitoring IC 1 and the microcomputer 3.

The battery monitoring IC 1 includes a first operation functioning device 6 and a second operation functioning device 7. The first operation functioning device 6 is a functioning device that operates only in an ordinary operation state in which the external power source 4 supplies the power to the battery monitoring IC 1. In addition, the second operation functioning device 7 is a functioning device that operates in a non-ordinary operation state in which the external power source 4 stops supplying power to the battery monitoring IC 1 in addition to the ordinary operation state.

Inside the battery monitoring IC 1, the power source supplied through the power supply switching device 5 is supplied to the first operation functioning device 6 through a first inner power source circuit 8, or is supplied to the second operation functioning device 7 through a second inner power source circuit 9. The voltage of the external power source 4 is 9.5V to 11V, the voltage of the assembled battery 2 is 120V, and the voltages of the first and second inner power source circuits are 5V. The above power source voltage values are one of examples. The assembled battery 2 and the external power source 4 are controlled to lower their voltages by a power source circuit (not shown), which is placed at the fore stage of the assembled battery 2 and the external power source 4, and then the voltages are supplied to the power source supply switching device 5. For example, the voltages supplied to the power source supply switching device 5 from the assembled battery 2 and external power source 4 are 7V and 7.2V respectively. A switching controller 10 monitors the power source voltage of the external power source 4, and stops the supply of inner power source operated by the first inner power source circuit 8 when it is detected that the power source voltage gets lower.

The first operation functioning device 6 includes, for example, a reference voltage circuit 11, an A/D converter (ADC) 12, an EPROM 13, a multiplexor (battery MUX) 14, and a communication input/output interface (I/F) 15. The reference voltage circuit 11 generates a reference voltage and supplies the reference voltage to the A/D converter 12 or other circuits. The terminal voltage of each battery cell 2a is switched and inputted through the multiplexor 14 to the A/D converter 12. The EPROM 13 stores data for correcting the data on which an A/D converting process is carried out by the A/D converter 12. The communication input/output I/F 15 is an interface that carries out communication between the first operation functioning device 6 and the microcomputer 3.

The second operation functioning device 7 includes, for example, an oscillation circuit 16, an equalization controller 17, a communication controller 18, a mode controller 19, a plurality of registers 20, an AD correcting calculation device 21, an EPROM controller 22, a watchdog timer (WDT) 23, and an oscillation monitor 24. The equalization controller 17 carries out discharging of one part of battery cells 2a so that the terminal voltages of the respective battery cells 2a are equalized. The oscillation circuit 16 performs oscillation output of a clock signal with a predetermined frequency, and directly supplies the clock signal to the WDT 23 and the oscillation circuit 24.

In addition, the clock signal is supplies as a gated clock through an AND gate 25 to the communication controller 18, the mode controller 19, the plurality of registers 20, the AD correcting calculation device 21 and the EPROM controller 22. The gate control, which is carried out by the AND gate 25, is performed to be in synchronization with the supply stopping control of the inner power source carried out by the first inner power source circuit 8. And the synchronization is performed by the switching controller 10. The switching controller 10 and the AND gate 25 correspond to a function limiter.

The communication controller 18 controls communication with the microcomputer 3 through the communication input/output I/F 15. The mode controller 19 controls the transition of a variety of operation modes of the second operation functioning device 7. And the detail of the mode controller 19 is described hereinafter. The EPROM controller 22 reads out the correction data by the EPROM 13 in the first operation functioning device 6, and controls to store the correction data in the plurality of registers 22. The AD correcting calculation device 21 corrects the data on which the A/D conversion is processed by the A/D converter 12 in the first operation functioning device 6 by using the correction data stored in the plurality of registers 22.

The WDT 23 is reset by a reset signal to be sent by the microcomputer 3 to the power source monitoring IC1 within a predetermined time. When the WDT 23 overflows without having the reset, a non-ordinary process signal is inputted to the switching controller 10. The oscillation monitor 24 monitors the oscillation state of the clock outputted by the oscillation circuit 16. When the oscillation monitor 24 detects a change in, for example, the frequency of the clock signal exceeding an allowance range, the non-ordinary process signal is inputted to the switching controller 10 similarly to the WDT 23.

Figure 2:
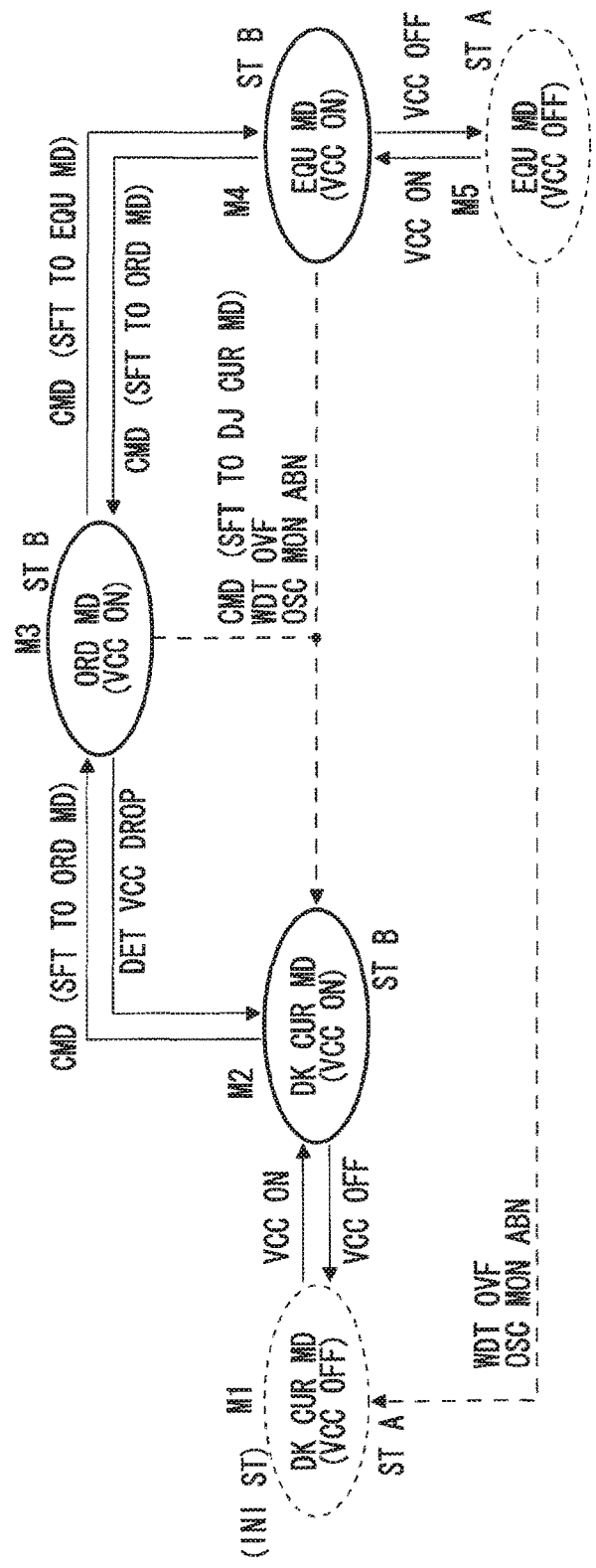
FIG. 2 is a diagram that shows the transition in an operation mode of a battery monitoring IC.
Figure 3:
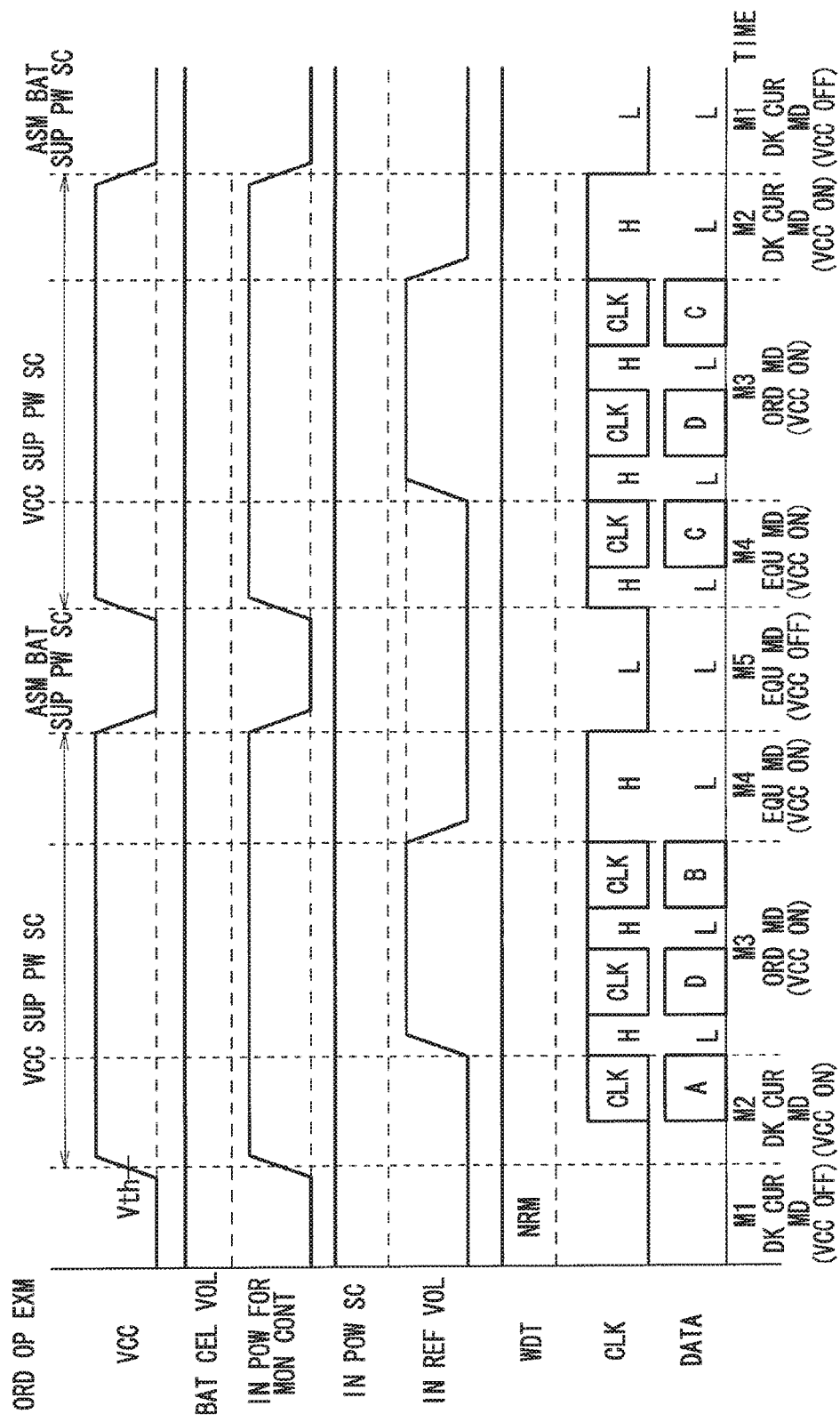
FIG. 3 is a time chart that illustrates an example of an operation in an ordinary state.

The following describes the functions of the present embodiments. As shown in FIG. 2, there are five types of operation modes in the power source monitoring IC1 as described below. It is noted that VCC power source in the figures corresponds to the external power source 4.

Mode [1] (M1 in the figures): Dark Current Mode, VCC power source OFF (State A);

Mode [2] (M2 in the figures): Dark Current Mode, VCC power source ON (State B);

Mode [3] (M3 in the figures): Ordinary Mode, VCC power source ON;

Mode [4] (M4 in the figures): Equalization Mode, VCC power source ON; and

Mode [5] (M5 in the figures): Equalization Mode, VCC power source OFF.

<Dark Current Mode>

The power is only fed to the second operation functioning device 7. In mode [1], the switching controller 10 outputs a low-level signal to the AND gate 25 so as to stop the supply of the clock signal. It is noted that it may be configured to make the switching controller 10 to lower the oscillation frequency of the oscillation circuit 16 (for example, from a MHz order to a KHz order) by removing the AND gate 25. The VCC power source may be in an on state or an off state.

<Ordinary Mode>

Both of the first operation functioning device 6 and the second operation functioning device 7 are in operation. The first operation functioning device 6 mainly carries out functions. The first operation functioning device 6 carries out a voltage acquisition process and a self-diagnosis process of the battery cells 2a and a communication process with the microcomputer 3. The first operation functioning device 6 sends the terminal voltage of the assembled battery 2 to the microcomputer 3. The VCC power source is in an on state.

<Equalization Mode>

The second operation functioning device 7 carries out the equalization process on the terminal voltages of the respective battery cells 2a. VCC power source may be in either an on-state or an off-state.

With regard to "state A" shown in the figures, when the VCC power source is turned into an off state, the power source monitoring IC 1 receives power supply from the assembled battery 2 and be in operation. The state A corresponds to a non-ordinary operational timing. In addition, with regard to "state B" in the figures, when the VCC power source is turned into an on state, the power source monitoring IC 1 receives the power supply from the external power source 4 and to be in operation. The state B corresponds to an ordinary operational timing.

In an initial state during which the external power source 4 is in an off state, the power source monitoring IC 1 is in the mode [1]. When the VCC power source is turned to an on state by the microcomputer, then the power source monitoring IC 1 is switched to the mode [2]. In the mode [2], when the microcomputer 3 sends the command having the instruction "shifting to the ordinary mode," the power source monitoring IC 1 is switched to the mode [3]. In addition, in mode [3], when the lowering of the VCC power source (for example, the voltage becomes less than 7 V) is detected, the power source monitoring IC 1 is switched back to mode [2].

In both of the modes [3] and [4], when the microcomputer 3 sends the command having the instruction "shifting to the equalization mode" or "switching to the ordinary mode," the power source monitoring IC 1 performs a switching from one mode to another mode. In both of the modes [4] and [5], when the microcomputer 3 switches the VCC power source to turn on or off, the power source monitoring IC 1 is switched from one more to another mode.

In addition, in the modes [3] and [4], when all of the three following events occur, then the power source monitoring IC 1 is switched to the mode [2].

Event 1: The transmission of a command having the instruction "shifting to the dark current mode" from the microcomputer 3;

Event 2: Overflow occurred in the WDT 23; and

Event 3: The detection of non-ordinary oscillation by the oscillation monitor 24.

In the mode [5], when the above-mentioned event 2 and event 3 occur, the power source monitoring IC 1 is switched to the mode [1]. In a case of being in the mode [1], the first operation functioning device 6, which receives the command, outputs a control signal to the switching controller 10.

With regard to the operation example "normal operation timing," the mode [1] is switched to the mode [5] through the modes [2], [3] and [4] sequentially, and subsequently the mode [5] is switched back to the mode [1] sequentially through the modes [4], [3] and [2]. The clock CLK is a data synchronization signal sent out from the microcomputer 3. The DATA [A] is the command having the instruction "shifting to the ordinary mode," and the DATA [B] or [C] is a command having the instruction "shifting to the equalization mode," "shifting to the ordinary mode," or "shifting to the dark current mode."

The oscillation output of the clock signal generated by the oscillation circuit 16 is used as an inner synchronization signal in a case of receiving the command sent from the microcomputer 3. The CLK signal sent out from the microcomputer 3 is fixed at a high-level when the VCC power source is in an on state in a period of having no communication; and the CLK signal is fixed to a low-level when the VCC power source is turned to an off state. DATA [D] indicates the communication command or transmission command related to, for example, a voltage detection process or a fault diagnosis process. In addition, the reference voltage generated by the reference voltage circuit 11 is outputted only in a period of the ordinary mode for the use in a case where the first operation functioning device 6 performs an A/D conversion process or a self-diagnosis process in response to the reception of the command.

Figure 4:
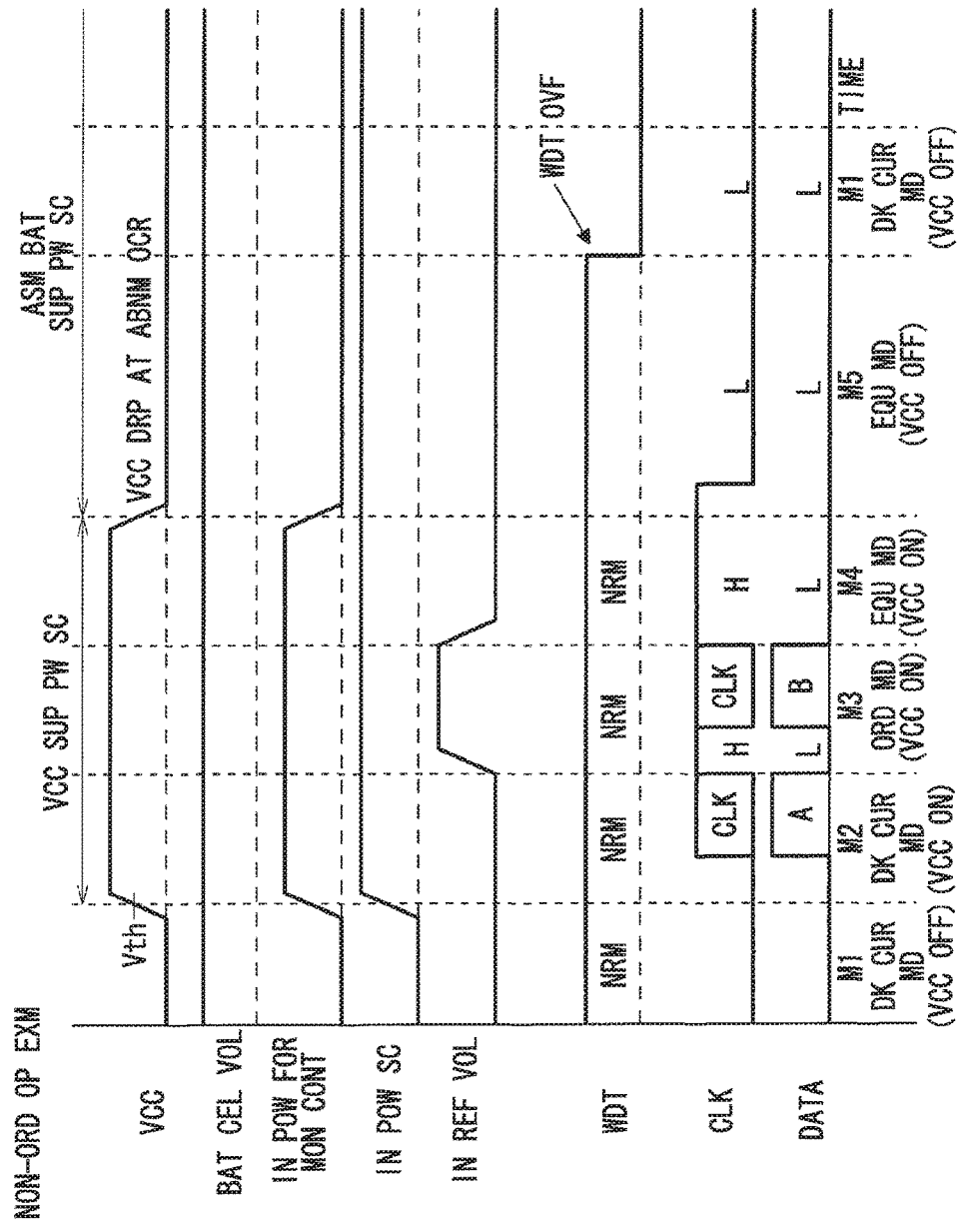
FIG. 4 is a time chart that illustrates an example of an operation in a non-ordinary state.

With regard to the operation "non-ordinary timing" illustrated in FIG. 4, the mode [1] is switched to mode [5] through the modes [2], [3], and [4] sequentially, and subsequently an abnormality occurs at the external part of the battery monitoring IC 1; and the external power source 4 is not switched back to an on state from an off state. Subsequently the mode [5] is shifted to the mode [1] when the WDT 23 overflows.

According to the present embodiment described above, the first operation functioning device 6 operates only in a case of the ordinary operation at which the operation power source is supplied by the external power source 4. The supply of the operation power source is controlled by the microcomputer 3. In addition, the first operation functioning device 6 performs a monitoring process on the assembled battery 2 and communication with the microcomputer 3. The second operation functioning device 7 performs the monitoring process on the assembled battery 2 in the timing of having the ordinary operation and in the timing of having the non-ordinary operation in which the supply of the operation power source carried out by the external power source 4 is stopped. Subsequently, the power supply switching device 5 and the switching controller 7 perform switching so as to supply the operation power source from the assembled battery 2 in the timing of non-ordinary operation.

According to the above configuration, the external power source 4 supplies the operation power source in the timing of ordinary operation when both of the first operation functioning device 6 and the second operation functioning device 7 are in operation; and it is switched to the supply of operation source carried out by the assembled battery 2 when the second operation functioning device 7 performs the monitoring process on the assembled battery 2 in the timing of having the non-ordinary operation in which the supply of the operation source carried out by the external power source 4 is stopped. Accordingly, the consumption of the energy stored in the assembled battery 2 is inhibited as much as possible in a period where the consumption power for operating both of the first operation functioning device 6 and the second operation functioning device 7 is large.

At the timing of the non-ordinary operation, at least one part of a plurality of functions included in the second operation functioning device 7 is restricted and/or stopped. In particular, it is configured that the supply of the clock signal to the second operation functioning device 2 is stopped; or the frequency of the clock signal is lowered. Therefore, the power consumption can be decreased in the timing of the non-ordinary operation.

The second operation functioning device 7 performs voltage equalization control, as the monitoring process, of the plurality of battery cells 2a. The first operation functioning device 6 detects the voltage of the assembled battery 2 and then sends the voltage to the microcomputer 3. The second operation functioning device 7, which is in operation in both of the timing of the ordinary operation and the timing of the non-ordinary operation, performs the voltage equalization control required for continuous execution. Since the first operation functioning device 6 operated only in the timing of the ordinary operation makes communication with the microcomputer 3 to send the voltage information of the assembled battery 2, a variety of functions are efficiently distributed so that the power consumption state can be optimized.

The first inner power source circuit 8 and the second inner power source circuit 9 receive power supply from the external power source 4 or the assembled battery 2. The first inner power source circuit 8 supplies the operation power source to the first operation functioning device 6, and the second inner power source circuit 9 supplies the operation power source to the second operation functioning device 2. When the switching controller 10 detects the voltage drop in the external power source 4, it is configured that the supply of the power source from the first inner power source circuit 8 to the first operation functioning device 6 is stopped. Therefore, the supply of the operation power source from the first inner power source circuit 8 through the switching controller 10 can be controlled.

The switching controller 10 performs switching so as to supply the operation power source from the assembled battery 2 when i) the first operation functioning device 6 receives the command having the instruction "shifting to the dark current mode" from the microcomputer 3; or ii) the WDT 23 overflows; or iii) the oscillation monitor 24 detects an abnormality in the oscillation state of the clock signal. Therefore, the battery monitoring IC 1 can be shifted to the dark current mode in a case of receiving the command from the microcomputer 3 or in a case of having an abnormality in the battery monitoring IC 1 or the microcomputer 3.

Second Embodiment

Figure 5:
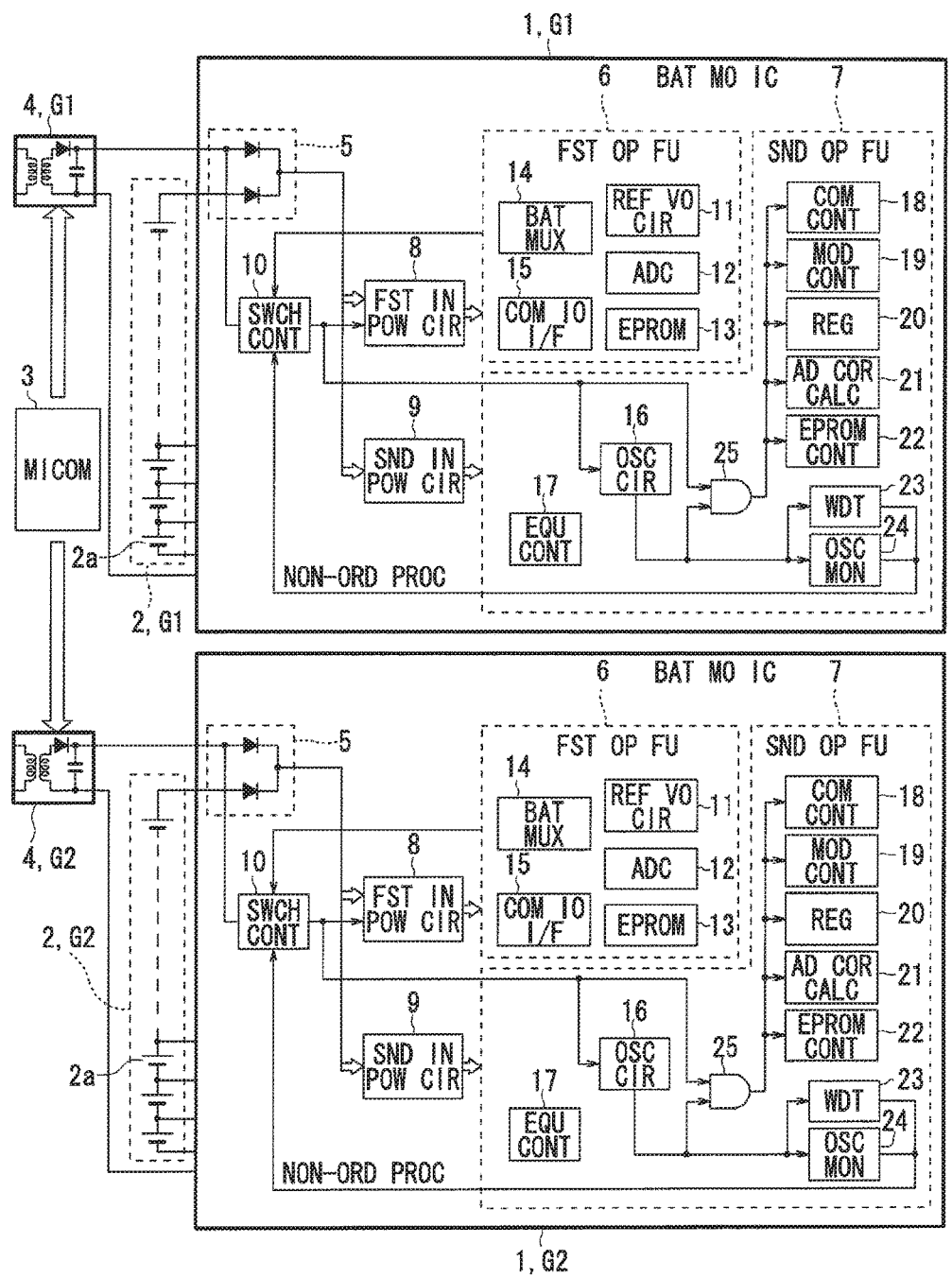
FIG. 5 is a functional block diagram that shows the configuration of an assembled battery monitoring system according to a second embodiment.

In the following, the parts identical to the ones, which are appended by the same reference numerals, described in the first embodiment will not be described, and only the parts different from the first embodiment are described. As illustrated in FIG. 5, the second embodiment includes two groups (denoted as G1, G2 in FIG. 4), and each of the groups G1, G2 has the battery monitoring IC 1, the assembled battery 2 and the external power source 4. The microcomputer 3 controls both of the external power source 4, G1 and the external power source 4, G2. In addition, the microcomputer 3 also communicates with both of the battery monitoring IC 1, G1 and the battery monitoring IC 1, G2.

Third Embodiment

Figure 6:
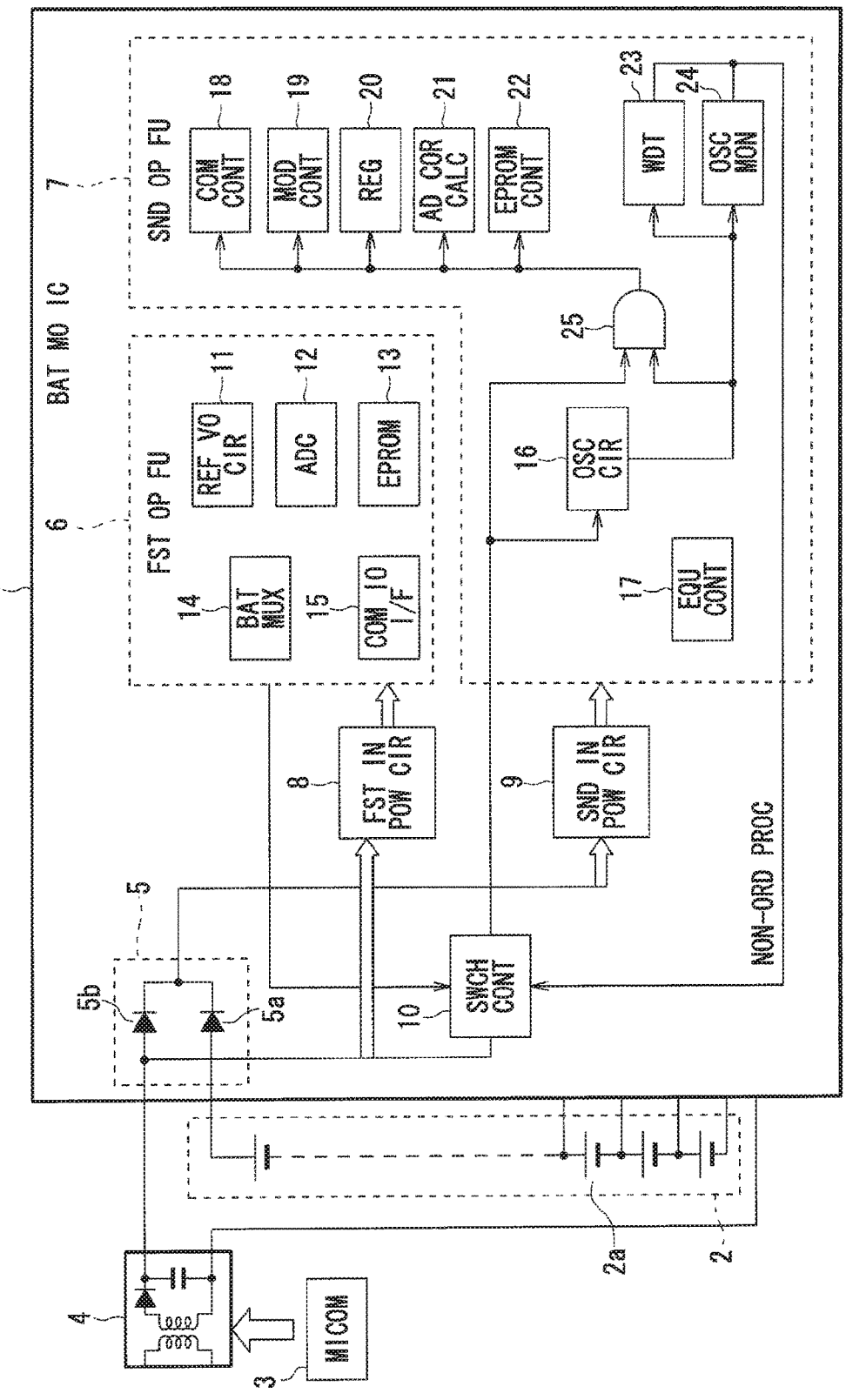
FIG. 6 is a functional block diagram that shows the configuration of an assembled battery monitoring system according to a third embodiment.

As illustrated in FIG. 6, a third embodiment is configured to directly receive a power supply from the external power source 4 and then the power is supplied to the first inner power source circuit 8 without flowing through the power supply switching device 5. This configuration achieves the effects similar to the one generated in the first embodiment.

Other Embodiments

The present application is not only restricted to the above description or the embodiments illustrates in the drawings.

With regard to the function included in the second operation functioning device 7, the function may be properly altered in accordance with an individual design. For example, the microcomputer 3 may control three or more external power sources 4 and three or more battery monitoring ICs 1.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An assembled battery monitoring apparatus comprising:
    a first operation functioning device that carries out a monitoring process on an assembled battery configured by a plurality of battery cells connected in series and communicates with a host controller through a communication input-and-output interface and a communication controller only in an ordinary operational timing in which the host controller controls an external power source to supply an operation power source;
    a second operation functioning device that carries out a monitoring process on the assembled battery in response to a command received by the first operation functioning device from the host controller in the ordinary operational timing and in a non-ordinary operational timing in which the external power source stops supplying the operation power source;
    a power supply switching device that performs switching so as to enable the assembled battery to supply the operation power source in the non-ordinary operational timing;
    a first inner power circuit that is configured to receive a power supply from the external power source or the assembled battery to supply the operation power source to the first operation functioning device; and
    a second inner power circuit that is configured to receive a power supply from the external power source or the assembled battery to supply the operation power source to the second operation functioning device,
    wherein the power supply switching device stops the first inner power circuit from supplying the operational power source to the first operation functioning device in response to detecting a voltage drop in the external power source and changes a supply source of the operation power source in response to the command received by the first operation functioning device from the host controller.

2. The assembled battery monitoring apparatus according to claim 1, further comprising:
    a function limiter that restricts or stops at least one part of a plurality of functions included in the second operation functioning device in the non-ordinary operational timing.

3. The assembled battery monitoring apparatus according to claim 2,
    wherein the function limiter stops to supply a clock signal sent to the second operation functioning device.

4. The assembled battery monitoring apparatus according to claim 2,
    wherein the function limiter lowers a frequency of a clock signal sent to the second operation functioning device.

5. The assembled battery monitoring apparatus according to claim 1,
    wherein the second operation functioning device carries out a voltage equalization control of the plurality of battery cells as the monitoring process.

6. The assembled battery monitoring apparatus according to claim 1, wherein the first operation functioning device detects a voltage of the assembled battery and sends a signal to the host controller as the monitoring process.

7. The assembled battery monitoring apparatus according to claim 1,
wherein the power supply switching device performs switching so as to enable the assembled battery to supply the operation power source when the first operation functioning device receives a command from the host controller.

8. An assembled battery monitoring apparatus comprising:
a first operation functioning device that carries out a monitoring process on an assembled battery configured by a plurality of battery cells connected in series and communicates with a host controller only in an ordinary operational timing in which the host controller controls an external power source to supply an operation power source;
a second operation functioning device that carries out a monitoring process on the assembled battery in the ordinary operational timing and in a non-ordinary operational timing in which the external power source stops to supply the operation power source; and
a power supply switching device that performs switching so as to enable the assembled battery to supply the operation power source in the non-ordinary operational timing,
wherein
the second operation functioning device includes a watchdog timer to be reset when the second operation functioning device receives a reset signal sent by the host controller within a time interval; and
the power supply switching device performs the switching so as to enable the operation power source supplied from the assembled battery when the watchdog timer overflows.

9. An assembled battery monitoring apparatus comprising:
a first operation functioning device that carries out a monitoring process on an assembled battery configured by a plurality of battery cells connected in series and communicates with a host controller only in an ordinary operational timing in which the host controller controls an external power source to supply an operation power source;
a second operation functioning device that carries out a monitoring process on the assembled battery in the ordinary operational timing and in a non-ordinary operational timing in which the external power source stops to supply the operation power source; and
a power supply switching device that performs switching so as to enable the assembled battery to supply the operation power source in the non-ordinary operational timing,
wherein
the second operation functioning device includes an oscillation monitor for monitoring an oscillation state of a clock signal; and
the power supply switching device performs the switching so as to enable the assembled battery to supply the operation power source when an abnormality in the oscillation state is detected.

10. An assembled battery monitoring system, comprising:
the assembled battery monitoring apparatus according to claim 1; and
the host controller according to claim 1.

* * * * *